United States Patent
Choquet et al.

(10) Patent No.: US 10,283,322 B2
(45) Date of Patent: May 7, 2019

(54) METHOD AND DEVICE FOR GENERATING A PLASMA EXCITED BY A MICROWAVE ENERGY IN THE ELECTRON CYCLOTRON RESONANCE (ECR) DOMAIN, IN ORDER TO CARRY OUT A SURFACE TREATMENT OR PRODUCE A COATING AROUND A FILIFORM ELEMENT

(71) Applicants: H.E.F., Andrezieux Boutheon (FR); Luxembourg Institute of Science and Technology (LIST), Esch-sur-Alzette (LU)

(72) Inventors: Patrick Choquet, Longeville les Metz (FR); David Duday, Luxembourg (LU); Olivier Blandenet, Meylan (FR); Thierry Leon Lagarde, Vif (FR)

(73) Assignees: H.E.F, Andrezieux Boutheon (FR); LUXEMBOURG INSTITUTE OF SCIENCE AND TECHNOLOGY (LIST), Esch-sur-Alzette (LU)

( * ) Notice: Subject to any disclaimer, the term of this patent is extended or adjusted under 35 U.S.C. 154(b) by 16 days.

(21) Appl. No.: 15/301,001

(22) PCT Filed: Mar. 26, 2015

(86) PCT No.: PCT/FR2015/050765
§ 371 (c)(1),
(2) Date: Sep. 30, 2016

(87) PCT Pub. No.: WO2015/150665
PCT Pub. Date: Oct. 8, 2015

(65) Prior Publication Data
US 2017/0032939 A1 Feb. 2, 2017

(30) Foreign Application Priority Data

Apr. 4, 2014 (FR) .................................... 14 53000

(51) Int. Cl.
*C23C 16/00* (2006.01)
*H01J 37/32* (2006.01)
(Continued)

(52) U.S. Cl.
CPC ...... *H01J 37/32192* (2013.01); *C23C 16/511* (2013.01); *H01J 37/3244* (2013.01);
(Continued)

(58) Field of Classification Search
USPC .................. 118/723 MW, 723 MA, 723 ME, 118/723 MR; 156/345.41, 345.42
See application file for complete search history.

(56) References Cited

U.S. PATENT DOCUMENTS 5,053,244 A * 10/1991 Kieser .................. C23C 16/511
427/162
5,079,033 A * 1/1992 Schulz .................. B01J 19/126
118/50.1
(Continued)

FOREIGN PATENT DOCUMENTS

EP 1075168 A1 2/2001
EP 1231292 A1 8/2002
(Continued)

OTHER PUBLICATIONS

International Search Report and Written Opinion issued in PCT/FR2015/050765, dated Jul. 10, 2015.

*Primary Examiner* — Rakesh K Dhingra
(74) *Attorney, Agent, or Firm* — Heslin Rothenberg Farley & Mesiti P.C.

(57) ABSTRACT

According to the process, the filiform component is continuously linearly moved through magnetic dipoles arranged opposite each other and around a tube constituting a treatment chamber, and the microwave energy is introduced between at least two magnetic dipoles.

12 Claims, 2 Drawing Sheets

(51) Int. Cl.
*C23C 16/511* (2006.01)
*C23F 1/00* (2006.01)
*H01L 21/306* (2006.01)

(52) U.S. Cl.
CPC .. *H01J 37/32403* (2013.01); *H01J 37/32513* (2013.01); *H01J 37/32678* (2013.01); *H01J 37/32733* (2013.01); *H01J 2237/3321* (2013.01)

(56) References Cited

U.S. PATENT DOCUMENTS

| | | | |
|---|---|---|---|
| 5,595,793 | A | 1/1997 | Blinov et al. |
| 6,638,569 | B2 | 10/2003 | McLaughlin et al. |
| 2002/0172780 | A1 | 11/2002 | Halverson |
| 2009/0294065 | A1* | 12/2009 | Lai ................ H01J 37/321 156/345.47 |
| 2010/0109532 | A1* | 5/2010 | Pelletier ........ H01J 37/32192 315/111.71 |
| 2010/0174245 | A1 | 7/2010 | Halverson |
| 2011/0079582 | A1 | 4/2011 | Yonesu et al. |

FOREIGN PATENT DOCUMENTS

| | | |
|---|---|---|
| EP | 1277874 A1 | 1/2003 |
| FR | 2667616 A1 | 4/1992 |
| FR | 2922358 A1 | 4/2009 |
| WO | 2005095078 A1 | 10/2005 |
| WO | 2006002673 A1 | 1/2006 |

* cited by examiner

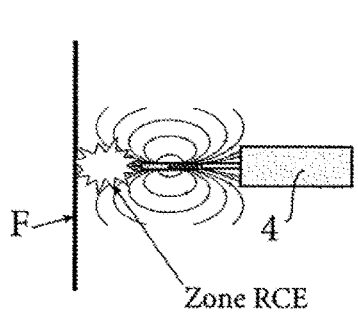
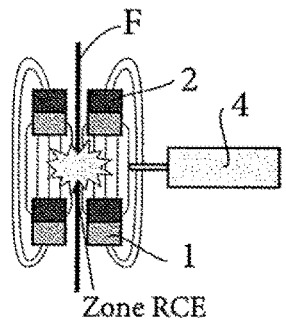
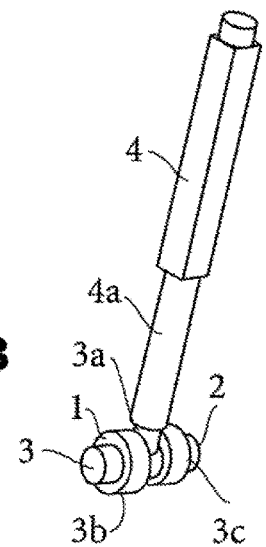
Fig. 1  Fig. 2  Fig. 3
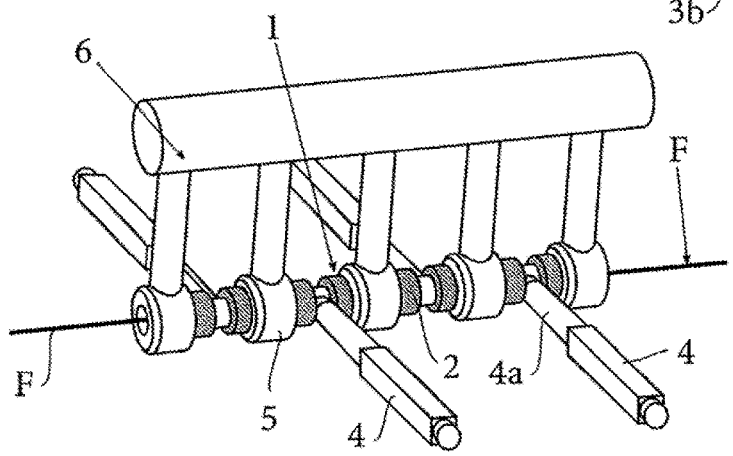
Fig. 4

METHOD AND DEVICE FOR GENERATING A PLASMA EXCITED BY A MICROWAVE ENERGY IN THE ELECTRON CYCLOTRON RESONANCE (ECR) DOMAIN, IN ORDER TO CARRY OUT A SURFACE TREATMENT OR PRODUCE A COATING AROUND A FILIFORM ELEMENT

CROSS REFERENCE TO RELATED APPLICATIONS

This application is the National Phase filing under 35 U.S.C. § 371 of International Application No. PCT/FR2015/050765, filed on Mar. 26, 2015, and published on Oct. 8, 2015 as WO/2015/150665 A1, and claims priority to French Application No. 1453000, filed on Apr. 4, 2014. The contents of each of the prior applications are hereby incorporated by reference herein in their entirety.

BACKGROUND ART

The invention relates to the technical sector of the production of plasma by electron cyclotron resonance (ECR) from a gas medium.

More particularly, the invention relates to the vacuum plasma surface treatment of any type of filiform components such as wires, tubes, fibres and more generally any other product the length of which is very long with respect to the diameter. The filiform component being continuously linearly driven.

Vacuum surface treatment by plasma refers to cleaning, pickling, activation, grafting of functions of coating of the surface for example by PECVD (Plasma-Enhanced Chemical Vapour Deposition) of the filiform component.

Many technical solutions to perform microwave applicators for the treatment of different types of parts are known. One can cite as an example, for information and without limitation purposes, the teaching of the patent EP 1075168 which relates to a process and a device to produce elementary plasmas in a view of creating an uniform plasma for a surface of use. One can also cite the teaching of the patent FR 2 922 358 which relates to a surface treatment process of at least one part by means of elementary plasma sources by electron cyclotron resonance. The different solutions resulting from these patents are particularly suited to the treatment of large surfaces or batches of parts placed next to one another and generally with multiple faces to be treated.

According to the prior art by using a microwave applicator with magnetic end piece, it appears that the plasma is generated at the end of each magnet creating a dense area of plasma. It is also known that in order to generate a low pressure microwave plasma, the electron cyclotron resonance effect is used. The probability of high speed shocks is considerably increased which creates a dense plasma in the ECR area. Thus, for a frequency of 2.45 GHz, the ECR area is at the magnetic field lines at 875 Gauss (G). This area at 875 Gauss (G) is around the magnet.

This technology of plasma application is not suitable for the continuous treatment of a wire (or other filiform component) requiring several applicators placed radially and repeated several times according to the running axis of the wire to be treatment to obtain a running speed.

Indeed, the volume of plasma being punctually located at the end of the applicators, several applicators all around the wire (or other filiform component) must be used to guarantee an axisymmetrical uniform deposition. Such a configuration requires a large deposition chamber which consumes large quantities of gas and energy. The multiplication of the applicators and the lack of compactness make this system expensive to build.

It therefore appears that the juxtaposition of conventional ECR sources does not allow obtaining a plasma configuration favourable to deposition on a filiform component.

For the treatment of wires under vacuum, according to the state of the art, PVD (physical vapour deposition) type treatments were proposed as made apparent from the teaching of the documents WO 2005/095078, WO 2006/002673, FR 2667616 and EP 1231292, EP 1277874.

U.S. Pat. No. 6,638,569 is also known according to which a conventional vacuum chamber is used and the wire is subjected to multiple reciprocating movements in the chamber in order to expose the maximum of surface of the wire to the plasma. This solution is of little efficiency as the surface of the wire is negligible with respect to the size of the chamber and results in relative complexity by implementing vacuum operating return systems.

From this state of the art, the aim sought is to be able to perform a surface treatment under vacuum by plasma as previously described on any type of filiform component. According to the teaching of U.S. Pat. No. 5,595,793, a coating is deposited by PECVD, for example a carbon coating, on a fibre by using a surface plasma microwave to generate the plasma. However, this solution is very limited in application given that it can only operate on dielectrics and only to perform electrical insulating depositions. In other words, conductive fibres cannot be coated. Furthermore, the frequency of the generator should be adapted to the dielectric constant of each material constituting the fibre. The process is therefore not easily transferable by switching from one material to another. Finally the process is difficult to control because as and when the deposition is executed, the dielectric constant of the material changes. This change has a retroactive effect on the coupling of the surface wave with the plasma.

It is therefore made apparent from this analysis of the state of the art that the plasma generation using applicators, is not suitable for the continuous treatment of filiform components, as the volume of the chamber is oversized with respect to the size of the component, the precursor gas and the energy required is significant whereas the plasma is not generated close to the wire to be coated. It is also made apparent that the alternative microwave plasma techniques based on surface waves are limited in their applications and difficult to implement.

The invention is aimed at overcoming these disadvantages in a safe, efficient and rational manner.

The problem the invention proposes to overcome is to allow for the generation of a linear plasma confined around any type of filiform component as defined, in order to minimise the volume of the chamber, and, consequently, the investment in the consumption of precursor gas and energy required in the aim of generating axisymmetrical plasma in order to guarantee the homogeneity of the treatment on the part, in particular by PECVD.

BRIEF SUMMARY OF THE INVENTION

In order to overcome such a problem, it has been designed and developed a process to produce a surface treatment or a coating under vacuum using a plasma excited by a microwave energy in the field of electron cyclotron resonance (ECR) around a filiform component according to which, the filiform component is continuously linearly moved through magnetic dipoles arranged opposite each other and around a tube constituting a treatment chamber, the microwave energy is introduced between at least two magnetic dipoles.

The invention also relates to a device to generate a treatment under vacuum by plasma on a filiform component continuously linearly driven and comprising means of production of a microwave energy in the field of cyclotron resonance wherein it includes at least one module composed of two magnetic dipoles arranged opposite each other and preferably mounted around a tube constituting a treatment chamber and through which the filiform component to be treated is linearly moved, a microwave applicator is mounted between the two dipoles.

It results from these characteristics that the size of the device (reactor) is reduced, thereby reducing the investments allowing for a reduction in gas consumption. It is also ascertained that the denser plasma is on the wire and no longer close to it as made apparent from the solutions resulting from the prior art, thereby enabling an increase in the deposition speed. These characteristics also allow for a homogeneous deposition to be obtained on the wire given the axisymmetry of the magnetic field lines. It is also to be noted, with regard to a plasma treatment in order to produce a chemical deposition, that this gives rise to better use of the monomer and slower soiling of the walls of the reactor.

According to other characteristics:

the magnetic dipoles are annular magnets. These annular magnets may be permanent magnets i.e. electromagnetic coils or any other means enabling to create a magnetic field the microwave applicator is arranged perpendicularly to the central axis of the tube, the tube constitutes a Tee, of which the median branch of which receives the microwave applicator whereas the other two branches receive the magnets on either side of said median branch.

The sizing of the annular magnets should be such that the magnetic field in the centre of the system between two magnets should be equal to the magnetic field at the electron cyclotron resonance.

For example if the annular magnets are coils of radius R including n coils covered by a current of amperage I, the distance D which separates these two coils should be such that:

$$\frac{m \cdot \omega}{e} = \frac{\mu_0 \cdot n \cdot I}{R} \left( \frac{R^2}{R^2 + \left(\frac{D}{2}\right)^2} \right)^{3/2}$$

Where m is the mass of electrons, e their charge and co the microwave pulse.

The Biot and Savart equation can be recognised in the right-hand term of this equation.

In one form of embodiment, the device includes several modules mounted in series in linear alignment and connected together by a sealing ring. Each ring acts either as a pumping zone by being linked to a gas pumping collector, or as a gas injection zone being linked to gas supply devices.

It is to be noted that the filiform component can be electrically polarised in order to allow for ion bombardment of the plasma. When the filiform component is polarised, an ionic layout of a gas can be achieved on the said component.

BRIEF DESCRIPTION OF THE DRAWING FIGURES

The invention is set out below in more detail with the help of the appended figure drawings in which:

FIG. 1 shows a principle diagram of a reactor according to the prior art to generate a deposition on a wire to be coated;

FIG. 2 is a view corresponding to FIG. 1 showing the principle of the device according to the invention;

FIG. 3 is a perspective view of a basic module of the device according to the invention;

FIG. 4 is a perspective view showing the assembly of several modules of the device to increase the treatment speed.

DETAILED DESCRIPTION

Figure 5:
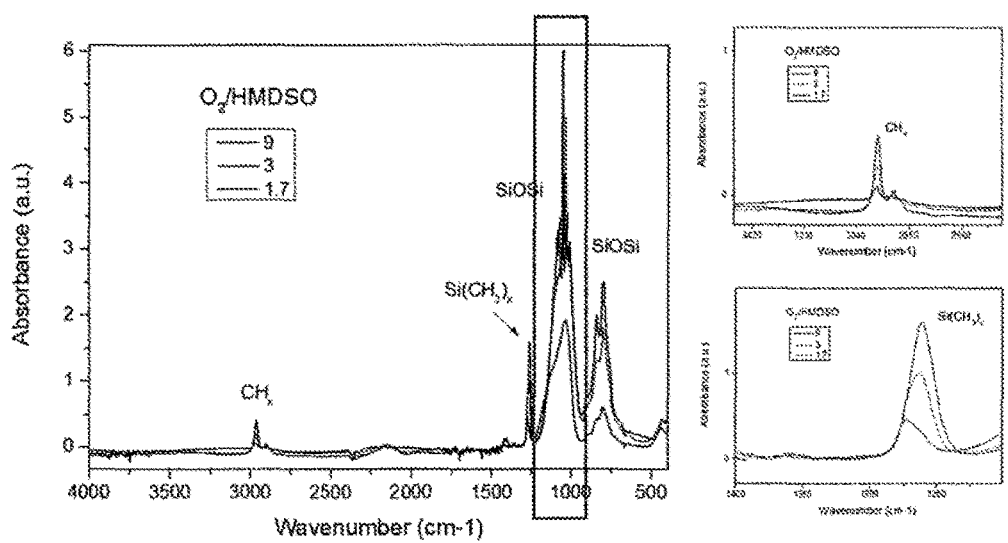
FIG. 5 is a curve of the FITR analyses very classically showing that the deposition approaches all the more to the $SiO_2$ when the $O_2$/HMDSO ratio is high.

As indicated, the invention finds a particularly advantageous application to generate a plasma with a view to the surface treatment of any type of filiform component, including a conductor, of the wire type, fibres, tubes, sleeves, etc and more particularly any component (F) of a significant length with respect to its diameter. The aim sought according to the invention is to continuously treat the component (F) on "passing", in other words, by linear driving of the wire.

According to the invention, the device or reactor comprises, at least one module comprised of two magnetic dipoles (1) and (2) arranged opposite and preferably mounted around a tube (3), constituting a treatment chamber. Each magnetic dipole (1) and (2) is for example made up of an annular magnet arranged concentrically to the tube (3). This assembly facilitates in particular the cooling of the magnets. In fact, as opposed to the ECR applicators described in the state of the art, the magnets are not under vacuum. Component (F) is engaged coaxially with the tube (3) and continuously linearly driven by any known and suitable means. A microwave applicator (4), of any known and appropriate type, is mounted between the two magnets (1) and (2). The microwave applicator (4) is arranged perpendicularly to the centre line of the tube (3). Preferably the opposite polarities are opposite so that the field lines are parallel to component F. Reference is made to FIG. 2 which shows that the plasma at the ECR area is on the wire. An axisymmetry of the magnetic field lines (C) is also ascertained allowing for a homogeneous deposition to be made on component (F).

In one form of embodiment, the tube (3) constitutes a Tee, the median branch of which (3a) receives the microwave applicator (4), in particular its coaxial guide (4a). The other two branches (3b) and (3c) of the Tee receive the magnets (1) and (2) on either side of the median branch (3a).

From this basic design of the device, it is possible to serial mount and in linear alignment several modules as shown in FIG. 4). In this configuration, the connection between the modules is provided by a sealing ring (5) which also acts as a pumping zone being connected to a connector (6) to pump gas. In this configuration the plasma and any reactive gases are preferably injected opposite the microwave applicators (injection not shown in the figure). An alternative configuration to the one shown consists in that the sealing rings alternatively act as a gas pumping zone and as a gas injection area.

The pumping is distributed between the centre of the reactor and the right and left ends of the latter. The filiform component (F) is linearly inserted into the treatment chamber resulting from the tube made up of a linear alignment and the series mounting of the different branches (3b), (3c) tubes and rings (5). To increase the running speed of the filiform component (F), it suffices to multiply the number of modules.

It is to be noted that it is not possible to inject, into each module, a suitable precursor and to laminate the pumping circuits to adjust the working pressures of each module.

Tests were performed with samarium cobalt ($Sm_2Co_{17}$) magnets without excluding any other material to generate a magnetic field of 875 G such as neodymium iron boron.

These tests were performed according to two configurations.

First Configuration:
The magnets have the following dimensions:
inside diameter 20 mm,
outside diameter 28 mm,
thickness 20 mm, polarisation according to thickness,
distance between magnets: 31.5 mm
opposite polarities between magnets.
Second Configuration:
The magnets have the following dimensions:
inside diameter 33.8 mm,
outside diameter 50 mm,
thickness 25 mm, polarisation according to thickness,
distance between magnets: 46 mm
characteristics of tube acting as treatment chamber: ND 25 i.e. 33.7 mm of outside diameter
opposite polarities between magnets.
In these two configurations:
The microwaves are injected in the middle of the space between the two magnets. The penetration depth of the microwave injector should be optimised to facilitate priming and operation of the plasma.
The magnets are at atmospheric pressure. The magnets are cooled on contact with an external casing in which a fluid circulates, for example water. The gas pumping zones and gas injection zones have been alternated.
The magnets are maintained in the system by three pressure screws to prevent being attracted.

The advantages are made well apparent from the description, the following is highlighted and recalled in particular:
the generation of a linear plasma confined around the component to be treated in order to minimise the volume of the chamber and as a consequence, to minimise the investments and consumption of precursor gas and energy,
the generation of an axisymmetrical plasma in order to guarantee the homogeneity of the deposition on the component to be treated,
the possibility of treating all types of filiform components including conductors of the wire type, fibres and more generally all products the length of which is greater than the diameter.

As an example, $SiO_x$ deposition tests by PECVD ECR in a reactor according to the second configuration are described below.
First PECVD Process
Flow rate of TMS (Tetramethylsilane): 5 sccm
Flow rate of $O_2$ (oxygen): 18 sccm
Pressure: $1.3 \cdot 10^{-2}$ mbar
Microwave injection power: 100 W With this $O_2$/TMS ratio of 3.6 the deposition speed found between the two magnets in the middle of the chamber is 250 nm/min.

The deposition speed is measured on a silicon plate placed in the centre of the reactor.
Second PECVD Process
Pressure: $1.10^{-2}$ mbar
Microwave injection power: 50 W
Use of a $O_2$/HMDSO Mix

| $O_2$/HMDSO ratio | Deposition speed nm/min |
| --- | --- |
| 9 | 530 |
| 3 | 875 |
| 1.7 | 1100 |

The invention claimed is:

1. A process to generate a plasma excited by microwave energy in a field of electron cyclotron resonance (ECR), to execute a surface treatment or coating around a filiform component, comprising:
arranging at least two annular magnets constituting magnetic dipoles at atmospheric pressure opposite each other and mounted concentrically around a tube constituting a treatment chamber, to produce axisymmetric magnetic field lines parallel to the filiform component,
continuously linearly moving the filiform component through the at least two annular magnets and the tube constituting a treatment chamber,
introducing the microwave energy to the tube, between the at least two annular magnets via a microwave applicator mounted between the at least two annular magnets, and
thereby generating a linear axisymmetrical plasma confined around the filiform component in the treatment chamber.

2. The process according to claim 1, wherein the surface treatment comprises a cleaning, a pickling, a functionalisation, or a grafting.

3. The process according to claim 1, wherein the coating is obtained by PECVD (plasma-enhanced chemical vapour deposition).

4. A device to generate a microwave excited plasma by electron cyclotron resonance (ECR), around a continuously linearly driven filiform component, comprising:
at least one module composed of two annular magnets constituting magnetic dipoles arranged at atmospheric pressure opposite each other and mounted concentrically around a tube constituting a treatment chamber, and producing axisymmetric magnetic field lines parallel to the filiform component wherein
the filiform component to be treated is linearly moved through the two annular magnets and through the tube constituting the treatment chamber, and
wherein the device further includes a microwave applicator connected to the tube, between the two annular magnets to introduce microwave energy between the two annular magnets,
thus generating a linear axisymmetrical plasma confined around the filiform component in the treatment chamber.

5. The device according to claim 4, wherein the annular magnets comprise permanent magnets.

6. The device according to claim 4, wherein the annular magnets comprise electromagnet coils.

7. The device according to claim 4, wherein the microwave applicator is arranged perpendicularly to a central axis of the tube.

8. The device according to claim 4, wherein the tube constitutes a Tee having a median branch and two other branches on either side of said median branch, the median branch receives the microwave applicator and the other two branches receive the annular magnets.

9. The device according to claim 4, wherein the device comprises several modules mounted in series and in linear alignment and connected together by a sealing ring.

10. The device according to claim 9, wherein each sealing ring acts as a pumping zone being connected to a gas pumping collector.

11. The device according to claim 9, wherein the sealing ring acts alternatively as a gas pumping zone and as a gas injection zone.

12. The device according to claim 4, wherein the filiform component is electrically polarised to allow an ion bombardment of the plasma.

* * * * *